(12) United States Patent
Jie et al.

(10) Patent No.: US 8,540,558 B2
(45) Date of Patent: Sep. 24, 2013

(54) COOLING AUXILIARY UNIT AND COOLING SYSTEM

(75) Inventors: Wei Jie, Kawasaki (JP); Keizou Takemura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1428 days.

(21) Appl. No.: 12/199,241

(22) Filed: Aug. 27, 2008

(65) Prior Publication Data
US 2009/0117842 A1 May 7, 2009

(30) Foreign Application Priority Data
Nov. 1, 2007 (JP) .................. 2007-284651

(51) Int. Cl.
H05K 5/00 (2006.01)
F24F 13/068 (2006.01)
F24F 7/007 (2006.01)

(52) U.S. Cl.
USPC ........................... 454/184; 454/186; 454/306

(58) Field of Classification Search
USPC ............... 454/184, 306, 3, 4, 32, 34, 35, 186
See application file for complete search history.

(56) References Cited

U.S. PATENT DOCUMENTS

| | | | | |
|---|---|---|---|---|
| 991,941 | A * | 5/1911 | Boettcher | 454/13 |
| 1,455,846 | A * | 5/1923 | Lewis | 236/44 R |
| 4,214,706 | A * | 7/1980 | Gee et al. | 239/553.3 |
| 5,238,452 | A * | 8/1993 | Levy et al. | 454/306 |
| 5,322,473 | A * | 6/1994 | Hofstra et al. | 454/186 |
| 6,318,113 | B1 * | 11/2001 | Levy et al. | 62/426 |
| 6,611,428 | B1 * | 8/2003 | Wong | 361/695 |
| 6,616,524 | B2 * | 9/2003 | Storck et al. | 454/184 |
| 7,403,391 | B2 * | 7/2008 | Germagian et al. | 361/695 |
| 2001/0029163 | A1 * | 10/2001 | Spinazzola et al. | 454/184 |

FOREIGN PATENT DOCUMENTS

| | | |
|---|---|---|
| JP | 55-38074 A | 3/1980 |
| JP | 60-223929 A | 11/1985 |
| JP | 8-219633 A | 8/1996 |
| JP | 9-97989 A | 4/1997 |
| JP | 2004-055883 A | 2/2004 |

OTHER PUBLICATIONS

Japanese Office Action dated Jul. 26, 2011, issued in corresponding Japanese Patent Application No. 2007-284651.

* cited by examiner

*Primary Examiner* — Craig Schneider
*Assistant Examiner* — Jonathan Waddy
(74) *Attorney, Agent, or Firm* — Westerman, Hattori, Daniels & Adrian, LLP

(57) ABSTRACT

A cooling auxiliary unit used for an accommodation room configured to accommodate an electronic apparatus includes a duct member that stands upon an ventilation hole provided on a raised floor, and has an air passage connected to the ventilation hole, and an opening connected to the air passage, and a fan that moves air along the air passage.

17 Claims, 8 Drawing Sheets

PRIOR ART

COOLING AUXILIARY UNIT AND COOLING SYSTEM

This application claims the benefit of Japanese Patent Application No. 2007-284651, filed Nov. 11, 2007, which is hereby incorporated by reference herein in its entirety.

BACKGROUND OF THE INVENTION

1. Field of the Invention

The present invention relates generally to a cooling auxiliary unit and a cooling system that utilizes it. The present invention is suitable for a computer accommodation room, or so-called data center, that houses plural servers, computers and electronic equipments, which will be referred to as an "accommodation room" hereinafter.

2. Description of the Related Art

As power dissipation increases along with the recently improving processing speed of a bulk computer, such as a server, the accommodation room has increasingly been required to have an efficient cooling capability. FIG. 8 is a schematic perspective view of a cooling system of a conventional accommodation room. Cooling air C supplied from under the floor 4 by an air conditioning machine 2 is introduced into an accommodation room 1 through a ventilation hole 5 of a floor 4. The floor 4 is raised having a space from a support member 3. Plural (four columns in the lateral direction times two rows in the depth direction) rack mount type servers 6 are arranged in the accommodation room 1 shown in FIG. 8. Each server 6 has a built-in fan (not shown) that inhales external air (therefore the cooling air C) and exhales warmed air W from a surface opposite to the inhalation surface. The warmed air W is taken into the air conditioning machine 2 from the ceiling side, cooled and circulated. The rack mount type server 6 stores plural electronic equipments and power supply units in the height direction.

Other prior art include Japanese Patent Laid-Open Nos. ("JPs") 60-223929, 9-97989, 8-219633, and 55-038074.

However, the cooling system shown in FIG. 8 may cause currents that turn the warmed air W to the air-inlet sides of the cooling air C. In addition, the cooling air C may not be uniformly supplied in a height direction of each server 6. More specifically, a lowermost server is supplied with a large amount of cooling air C whereas an uppermost server may run short of an amount of the cooling air C. As a result, electronic equipments located high positions in each server are less likely to be cooled, and the cooling effect also becomes uneven.

SUMMARY OF THE INVENTION

The present invention is directed to a cooling auxiliary unit and a cooling system having a high cooling efficiency.

A cooling auxiliary unit according to one aspect of the present invention used for an accommodation room configured to accommodate an electronic apparatus includes a duct member that stands up on an ventilation hole provided from the raised floor, and has an air passage connected to the ventilation hole, and an opening connected to the air passage, and a fan that moves air along the air passage. According to this cooling auxiliary unit, the fan moves air, e.g., ascends the cooling air and descends the warmed air. As a result, this configuration can ascend the cooling air to a high position of the electronic apparatus in ascending the cooling air, and prevent ascending of the warmed air and a stream of the warm air in descending the warm air.

The duct member may have a rectangular, circular, or polygonal section perpendicular to an upper vertical direction. The rectangular or polygonal shape is convenient when the electronic apparatus is arranged at least one of sides of the duct member. The circular shape is convenient when plural electronic apparatuses are arranged around the duct member. The cooling auxiliary unit may be arranged between a pair of electronic apparatuses, wherein where D is an interval between the pair of electronic apparatuses, the duct member may have a width Px in a direction parallel to the interval, which generally meets $3Px \leq D \leq 10Px$. When D is smaller than 3Px, it is difficult for a maintenance person to enter between the electronic apparatus and the cooling auxiliary unit for maintenances. When D is greater than 10Px, a distance between the electronic apparatus and the cooling auxiliary unit becomes too large, causing the cooling air to drop in the lower vertical direction. As a result, it becomes difficult to uniformly cool the electronic apparatus in the height direction, or to prevent a stream of the warmed air. The duct member may be made of resin. When the duct member is made of resin molding, the air passage and openings can be precisely and easily formed. The fan may be provided in the duct member. Thereby, a movement of the air in the air passage (ascending of the cooling air and descending of warmed air) can become efficiently.

The cooling auxiliary unit may further include a top plate that is fixed onto the duct member at a position higher than the electronic apparatus, and configured to shield the air passage. The top plate can prevent a stream of the warmed air for efficient cooling. A bottom surface of the top plate may be higher than the electronic apparatus in a vertical direction by 20 cm to 40 cm. When the distance is smaller than 20 cm, the top plate is too close to the electronic apparatus and is not preferable for some safety purposes. The distance greater than 40 cm lowers an air curtain effect due to the cooling air exhaled from the openings, and degrades a warmed air stream preventive effect.

A section of the duct member may have an increased width perpendicular to an upper vertical direction from a position at which the duct member is as high as the electronic apparatus to a position at which the top plate is fixed. This configuration increases an area of the openings, and thus the number of openings and the air capacity. A large air capacity can effectively prevent a stream of the warm air. The top plate may have a rectangular, circular, or polygonal section perpendicular to an upper vertical direction. The rectangular or polygonal shape is convenient when the electronic apparatus is arranged at least one of sides of the top plate. The circular shape is convenient when plural electronic apparatuses are arranged around the top plate.

The cooling auxiliary unit may be arranged between a pair of electronic apparatuses, and $0.7D \leq Dc \leq 1.3D$ is met where Dc is a width of the top plate, and D is a distance between the pair of electronic apparatuses. Dc smaller than 0.7D would make large a distance between the top plate and the electronic apparatus, and a prevention of the warmed air becomes insufficient. When Dc is greater than 1.3D, a vicinity of the top of the electronic member is close to the duct member, and it is difficult for a maintenance person to operate or maintain the electronic apparatus. In addition, when plural top plates are provided, these top plates may interfere with each other.

A cooling system according to another aspect of the present invention used for an accommodation room configured to accommodate an electronic apparatus includes a cooler configured to supply cooling air, and the above cooling auxiliary unit. This cooling system has the cooling auxiliary unit, and exhibits the above operation. The cooler may be formed as an air conditioning machine that exhales the cooling air and exhales the warm air.

The present invention can provide a cooling auxiliary system and a cooling system having high cooling efficiency.

Further features of the present invention will become apparent from the following description of exemplary embodiments (with reference to the attached drawings).

DESCRIPTION OF THE EMBODIMENTS

Figure 1:
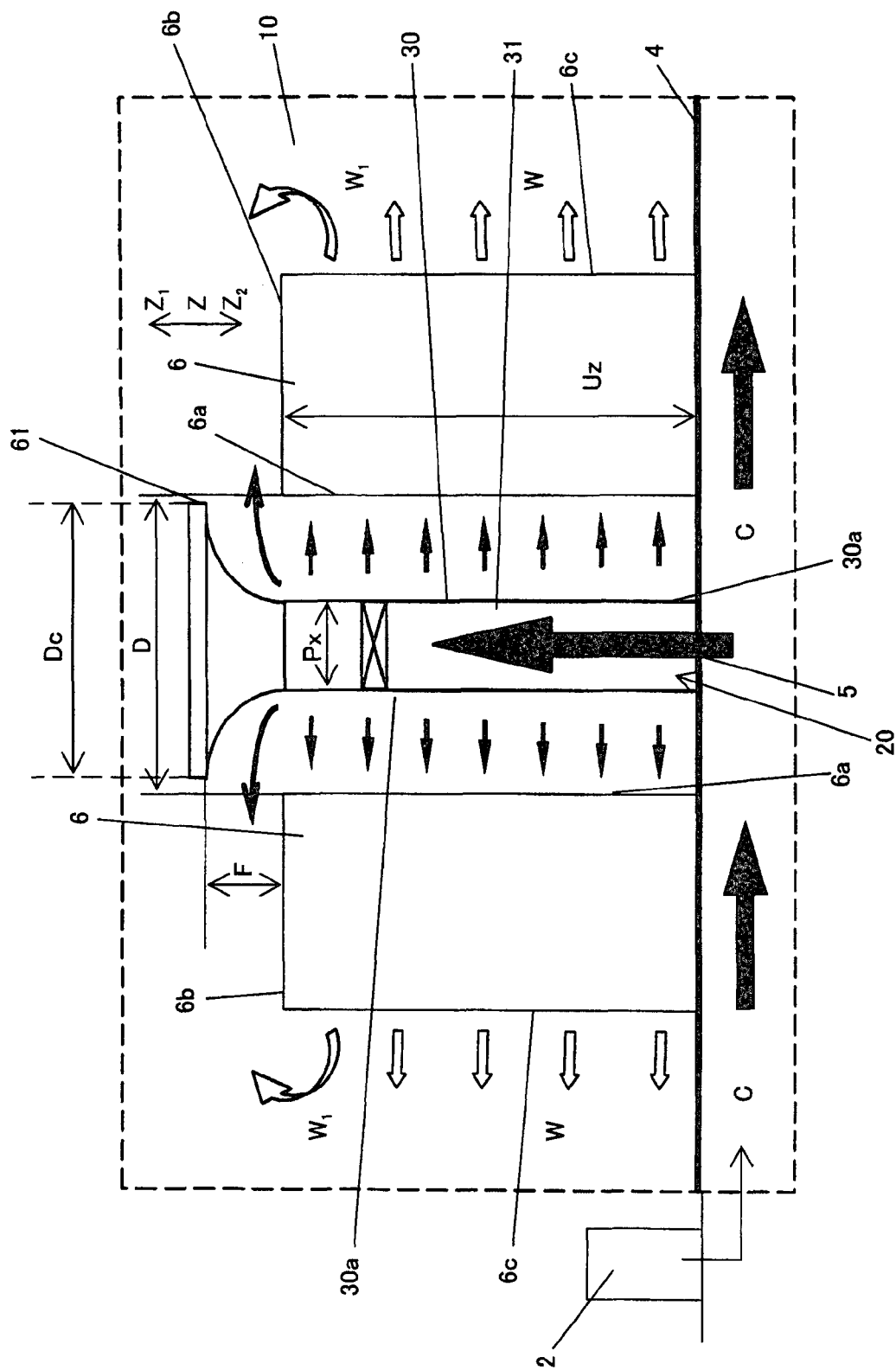
FIG. 1 is a schematic partially enlarged sectional view of an accommodation room according to one embodiment of the present invention.
Figure 8:
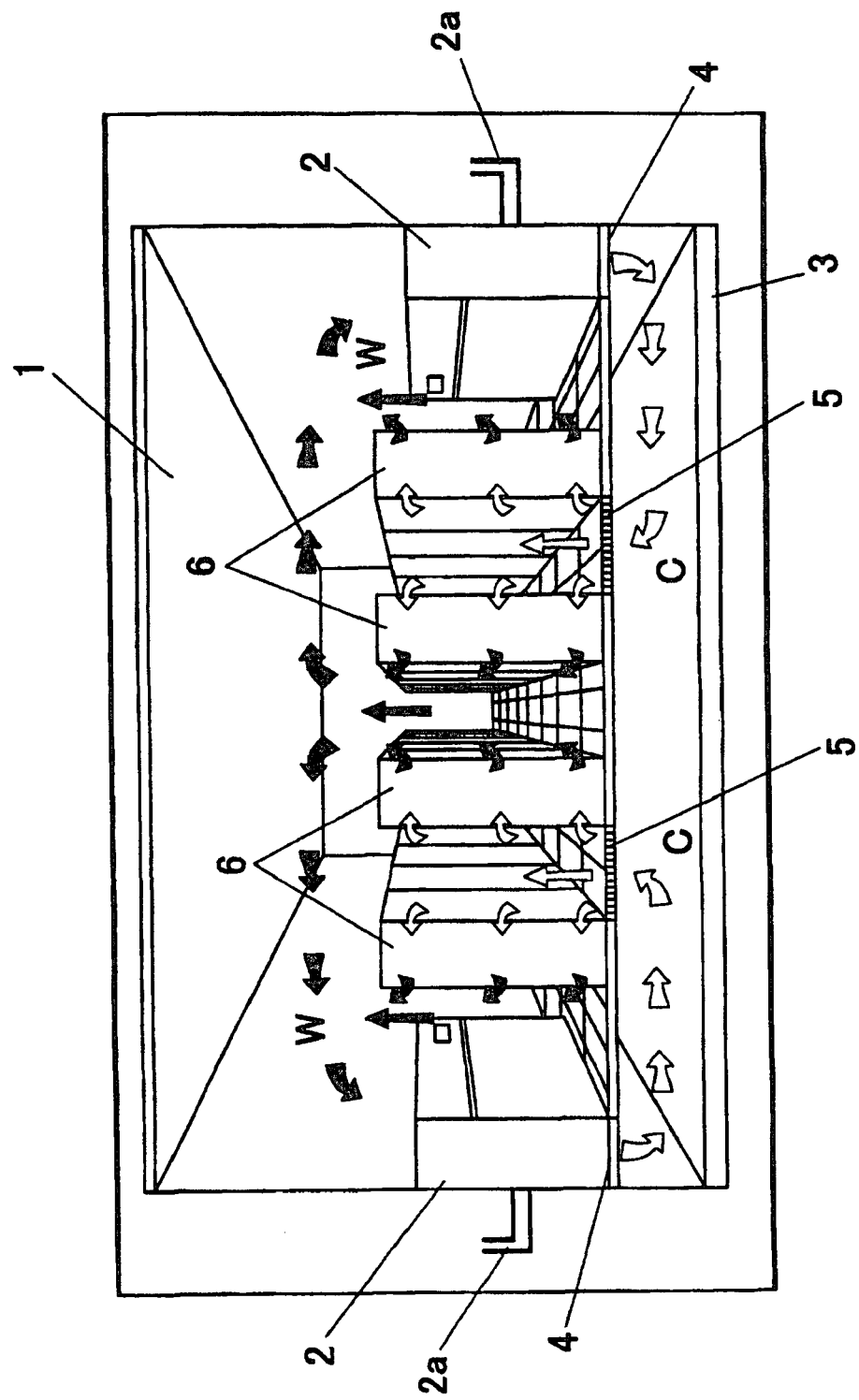
FIG. 8 is a schematic perspective view of a conventional accommodation room.
Figure 9:
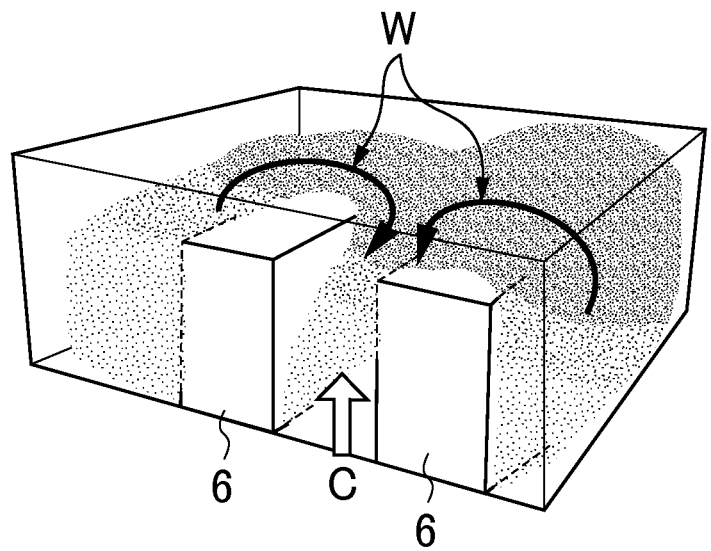
FIG. 9 is a perspective view for explaining problems of the accommodation room shown in FIG. 8.

FIG. 1 is a schematic partially enlarged sectional view of an accommodation room 10. In FIG. 1, a vertical direction is a Z direction, and a horizontal direction is an X direction. An upper vertical direction is a $Z_1$ direction, and a lower vertical direction is a $Z_2$ direction. The accommodation room 10 is different from the accommodation room 1 shown in FIG. 8 in having plural cooling auxiliary units 20, and other than that, the accommodation room 10 has the same structure as the accommodation room 1. Thus, the accommodation room 10 is supplied with cooling air C from under the floor 4 via a ventilation hole 5 in the floor 4, and plural rack mount type servers 6 (electronic apparatuses) or servers (electronic apparatus) (not shown) installed in each rack mount type server 6. Therefore, those elements in FIG. 1, which are corresponding elements I FIG. 8, are designated by the same reference numerals, and a description thereof will be omitted.

Figure 2:
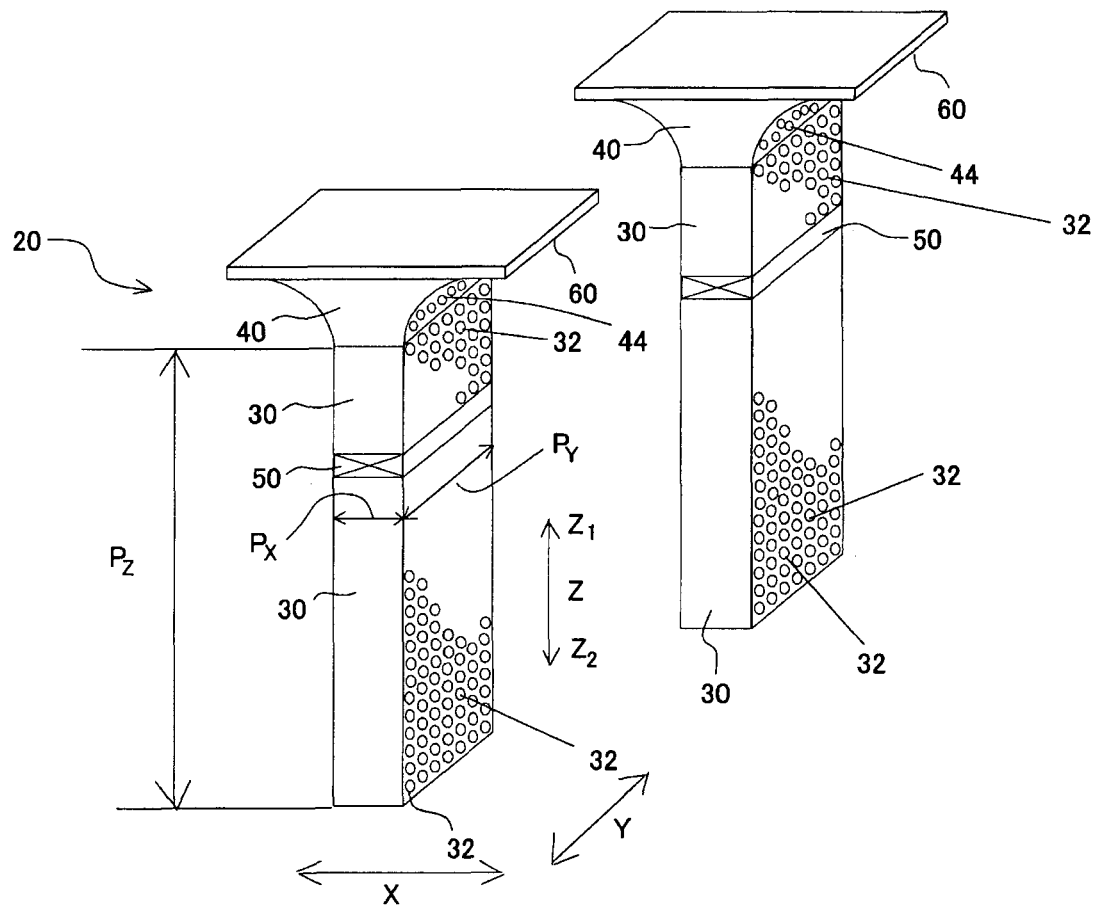
FIG. 2 is a schematic perspective view of a cooling auxiliary unit shown in FIG. 1.

The cooling auxiliary unit 20 is used for the accommodation room 10, and emits the cooling air C from at least one surface to the outside. The cooling auxiliary unit 20 is located between a pair of rack mount type server units 6 in FIG. 1. FIG. 2 is a perspective view of a pair of cooling auxiliary units 2 arranged in a direction perpendicular to the paper plane shown in FIG. 1. The cooling auxiliary unit 20 is arranged on the side of an inhalation surface 6a of each server 6. Each inhalation surface 6a has a door that opens when drawn to the front, enabling each server to be attached and ejected. However, the present invention does not necessarily require the severs 6 to be arranged at both sides of each cooling auxiliary unit 20.

The cooling auxiliary unit 20 has a pillar shape, and includes, as shown in FIG. 2, duct members 30 and 40, a fan 50, and a top plate 60.

The duct member 30 has a rectangular section perpendicular to the upper vertical direction $Z_1$ in FIG. 2. The rectangular shape includes a square and a rectangle, but the present invention is not limited to this shape as described with reference to FIGS. 4 to 8. The duct member 30 stands up on the ventilation hole 5, and has an air passage 31 and plural openings 32. The air passage 31 is a passage connected to the ventilation hole 5, allows the cooling air C to pass, and extends in the Z direction.

The duct member 30 has a pair of exhalation surfaces 30a. Each exhalation surface 30a is parallel to the inhalation surface 6a of the server unit 6, and has plural openings 32. Each opening 32 is connected to the air passage 31, and releases the cooling air C. When the cooling system is a ceiling type, 30a serves as an inhalation surface and each opening 32 is connected to the air passage 31 and inhales the warmed air W.

In this embodiment, each opening 32 has the same circular shape, and the exhalation surface 30a has a constant open area ratio between 30 to 40%. FIG. 2 shows only some of the openings 32 for illustration purposes. This embodiment arranges the cooling auxiliary unit 20 in the middle of the pair of servers 6, and equally sets the open area ratio of each exhalation surface 30a. However, the cooling auxiliary unit 20 may be arranged closer to one of the servers 6, and the open area ratio may be made different between both exhalation surfaces 30a. For example, when the right server 6 has a higher power dissipation, the open area ratio of the right exhalation surface 30a may be increased. When the space necessary to open the door of the inhalation surface 6a of the right server 6 is smaller than that of the left server 6, the cooling auxiliary unit 20 may be arranged closer to the right server 6.

Assume that the Y direction is a direction perpendicular to the XZ plane. As shown in FIG. 2, the duct member 30 has lengths of Px, Py, and Pz in XYZ directions. In addition, assume that D is an interval of the pair of server unit 6 in the X direction, and Uz is a height of each server unit 6 in the Z direction in FIG. 1. Then, Px may meet the following equation:

$$3Px \leq D \leq 10Px \tag{1}$$

D smaller than 3Px makes hard to open the door of the inhalation surface 6a of the server 6. D greater than 10Px makes the duct member 30 too distant from the server unit 6, causing the cooling air C to drop in the $Z_2$ direction. As a result, it becomes difficult to uniformly cool the servers in the Z direction. In this embodiment, Px is set between 20 and 30 cm, and D is set between about 1.2 and 2.0 m.

In this embodiment, Py is approximately as long as the length of the server 6 in the Y direction perpendicular to the paper plane shown in FIG. 1. This configuration can supply the cooling air C over the Y direction of the server 6, and can uniformly cool each electronic equipment (not shown) in the Y direction. However, as will be described later, Py may be integer (greater than 2) times as long as the length of the server 6 in the Y direction. Pz may be approximately equal to Uz. This configuration can uniformly supply the cooling air C to the server 6 over the Z direction, and uniformly cool each electronic equipment (not shown) in the Z direction.

When viewed from the XZ plane shown in FIG. 2, the duct member 40 has an increased X length in the $Z_1$ direction from a border between the duct members 40 and 30, which border is as high as a top plate 6b of the server unit 6. Plural openings 44 each having the same shape as that of the opening 32 are formed on a YZ plane of the duct member 40. The YZ plane is a curved surface in this embodiment but may be a bevel surface. The opening 44 emits the cooling air C, similar to the opening 32. The cooling air C emitted from the openings 32 is mainly taken in the server unit 6, and used to cool internal electronic equipments and servers. On the other hand, the cooling air C emitted from the openings 44 is mainly used to form an air curtain configured to prevent a stream of the warmed air W (or a return of the warmed air W to between the pair of server units 6).

Figure 3:
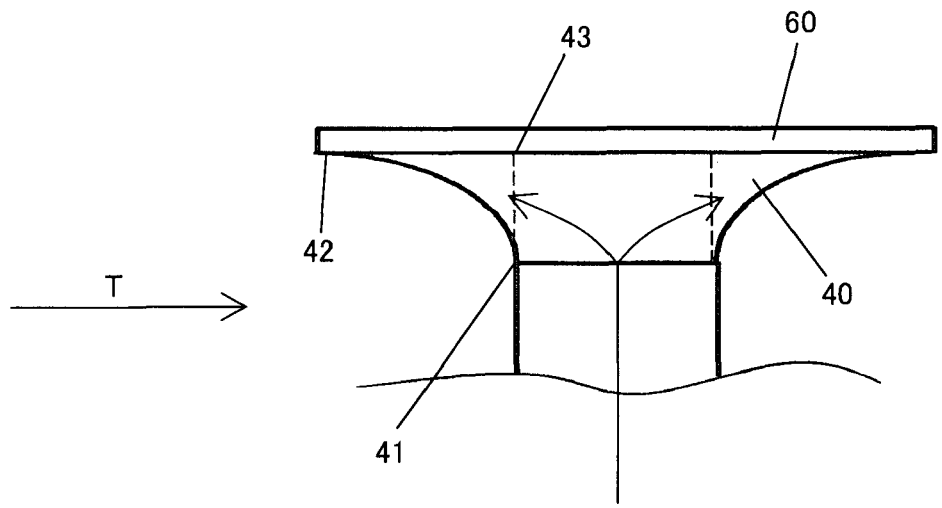
FIG. 3 is a schematic perspective view of a cooling auxiliary unit shown in FIG. 2.

FIG. 3 is a side view near the duct member 40 viewed from the XZ directions. Dotted lines show a duct member 40 that would be produced with the same width Px of the duct member 30. 41 denotes an end in the X direction of the border between the duct members 40 and 30. 42 denotes an end in the X direction of the duct member 40 connected to the top plate 60. 43 denotes an end in the X direction between the duct member 40 and the top plate 60 if the duct member 40 is produced with the same width Px of the duct member 30. Then, when the duct member 40 is viewed from a T direction facing the YZ plane, the YZ curved surface shown by a solid line that has the ends 41 and 42 has a larger area than the YZ plane shown by a dotted line that includes the ends 41 and 43. When the open area ratio is the same, the openings 44 of the YZ curved surface shown by the solid line having the ends 41 and 42 can have a larger area and thus a larger air capacity. A large air capacity can effectively prevent a stream of the warm air W.

The duct members 30 and 40 may be formed by resin molding. Thereby, the openings 32 and 42 can be precisely formed.

The fan 50 is provided on the way of or in the duct member 30, and ascends the cooling air C introduced from the ventilation hole 5 along the air passage 31. The conventional configuration has no fan 50, and the cooling air C introduced through the ventilation hole 5 is likely to gather near the floor 4. Therefore, the conventional configuration cannot uniformly supply the cooling air C to the server unit over the Z direction, and cannot uniformly cool servers (not shown) that are housed in the server unit 6 in the Z direction. On the other hand, this embodiment solves the conventional problem because the fan 50 ascends the cooling air C in the $Z_1$ direction and supplies the cooling air C to servers at high positions. In this embodiment, the fan 50 ascends the cooling air C along the air passage 31 at 3 m/s.

The fan 50 may not be necessarily provided in the duct member 30. For example, as long as the cooling air C can be ascended above the top plate 6b of the server unit 6, the fan 50 may be provided at the ventilation hole 5 in the floor 4, or to the duct member 40.

The top plate 60 is fixed onto the top of the duct member 40 at a position higher than the top plate 6b of the server unit 6, and shields the air passage 31. Therefore, the cooling air C that ascends along the air passage 31 collides with the top plate 60. In this embodiment, a bottom surface 61 of the top plate 60 is higher than the top plate 6b of the server unit 6 by 20 cm to 40 cm. In FIG. 1, a distance F between a position of the bottom surface 61 of the top plate 60 extended in the X direction and the top surface 6b of the server unit 6 is between 20 cm and 40 cm. When the distance F is smaller than 20 cm, it may close the space between the pair of electronic apparatuses and is not preferable for fire preventive and other safety purposes. On the other hand, the distance F greater than 40 cm lowers an air curtain effect due to the cooling air exhaled from the openings 44.

When it is assumed that Dc is a width of the top plate 60 in the X direction, Dc can meet the following equation:

$$0.7D \leqq Dc \leqq 1.3D \tag{2}$$

Dc smaller than 0.7D would make large a distance between the end of the top plate 60 and the end of the top surface 6b of the server unit 6, and a shield of the warmed air W becomes insufficient. Dc greater than 1.3D would cause interference between the door of the inhalation surface 6a and the duct member 40 near the top surface 6b of the server unit 6, and makes the opening of the door difficult. In addition, the door may interfere with another top plate that is arranged in the X direction.

The top plate 60 of this embodiment is a rectangular flat plate and arranged parallel to the X direction, but the shape is not limited to this embodiment, as will be described later.

Figure 4A:
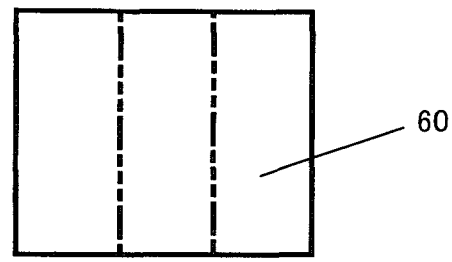
FIGS. 4A and 4B are plane views of a top plate applicable to the cooling auxiliary unit shown in FIG. 2.
Figure 4B:
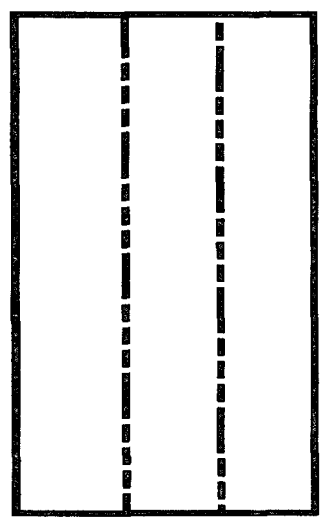
Figure 5:
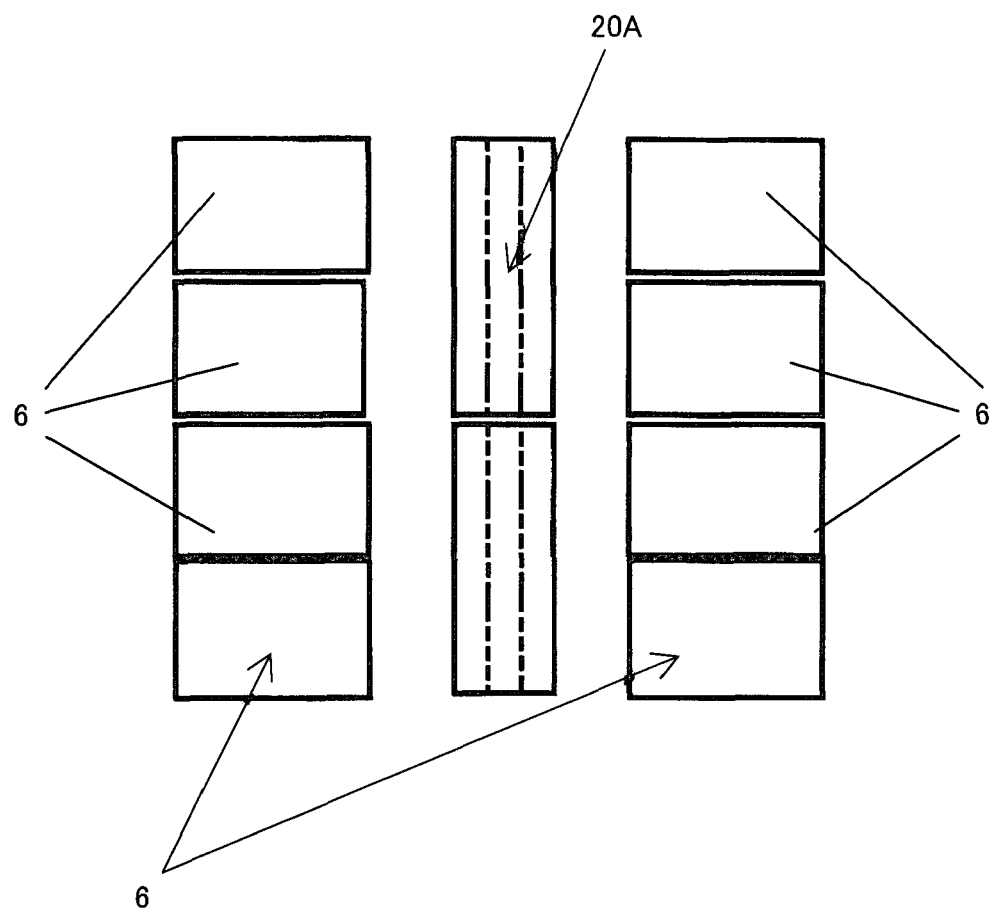
FIG. 5 is a plane view showing an arrangement when the cooling auxiliary unit having a top plate shown in FIG. 4B is used.

The top plate 60 shown in FIG. 2 has a square shape, as shown in FIG. 4A, but a top plate 60A having a rectangular shape shown in FIG. 4B may be used. Dotted lines shown in FIGS. 4A and 4B indicate contours that transmit the duct member 30 when the top plates 60 and 60A are viewed from the top. FIG. 5 is a top view of an illustrative arrangement of the server units 6 and the cooling auxiliary unit 20A having the top plate 60A shown in FIG. 4B. One cooling auxiliary unit 20A is used for two server units 6 at one side.

Figure 6A:
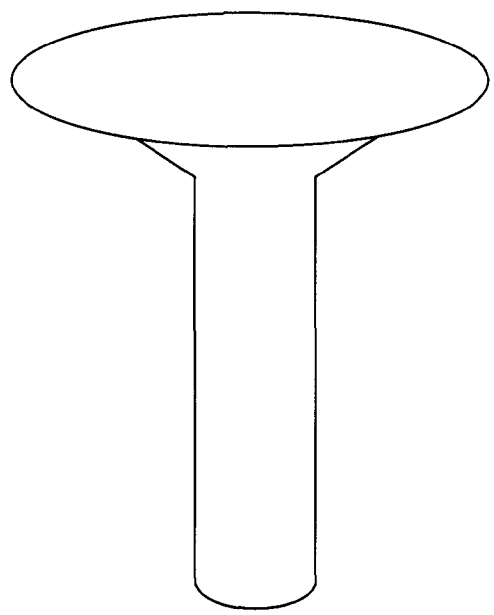
FIG. 6A is a perspective view of a variation of the cooling auxiliary unit shown in FIG. 2.
Figure 6B:
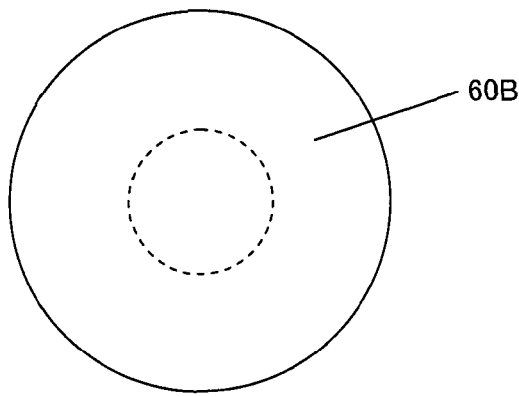
FIGS. 6B and 6C are plane views of top plates applicable to the cooling auxiliary unit shown in FIG. 6A.
Figure 6C:
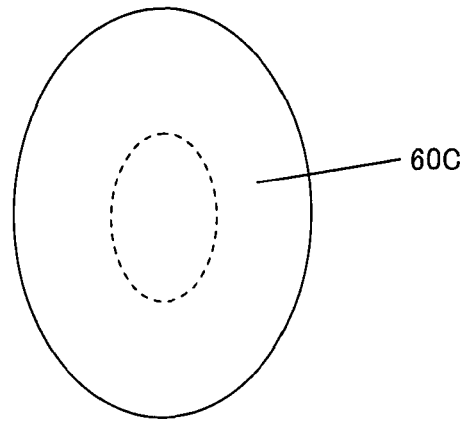
Figure 7:
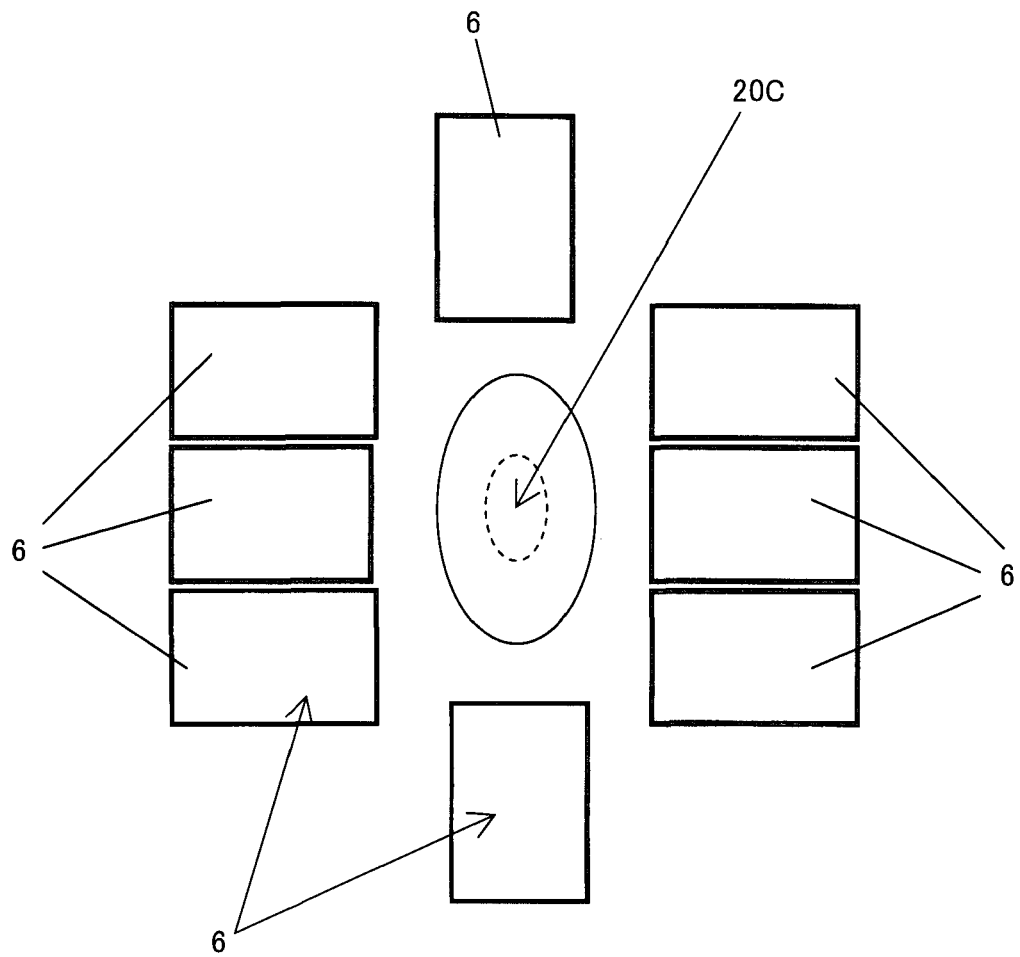
FIG. 7 is a plane view showing an arrangement when the cooling auxiliary unit having a top plate shown in FIG. 6C is used.

The top plate 60 may be replaced with a circular top plate 60B shown in FIG. 6B, or an elliptical top plate 60C shown in FIG. 6C, or a polygonal top plate. Dotted lines shown in FIGS. 6B and 6C are contours that transmit the duct member 30 when the top plates 60B and 60C are viewed from the top. Similarly, the section of the duct member 30 perpendicular to the $Z_1$ direction is not limited to a rectangle and may be a circle or a polygon. FIG. 6A is a perspective view of a cooling auxiliary unit 20B in which the duct member 30 has a circular section perpendicular to the $Z_1$ direction. FIG. 7 is a top view showing an illustrative arrangement of the server units 6 and a cooling auxiliary unit 20C having a top plate 60C shown in FIG. 6C. In this case, the openings 32 are provided around the duct member 30.

In operation of the accommodation room 10, the cooling air C supplied from the air conditioning machine 2 is introduced from the ventilation hole 5 to the air passage 31, and ascended by the fan 50 in the $Z_1$ direction. Part of the cooling air C is introduced by the fan (not shown) in the server unit 6 from the inhalation surface 6a to the interior of the server unit 6, and used to cool plural servers (not shown) in the server unit 6. Since the cooling air C is supplied to upper servers by the fan 50, the upper servers can be sufficiently cooled. The cooling air C becomes the warmed air W after passing in the server unit 6. Part $W_1$ of the warmed air W attempts to circulate between the pair of server units 6, but the cooling air C exhaled from the openings 44 of the duct member 40 forms the air curtain and pushes the warm air $W_1$ to the outside. This configuration can prevent a current of the warm air, and improve the cooling efficiency. The top plate 60 also prevents the current of the warmed air $W_1$ from the ceiling side. The warmed air W is taken in the air conditioning machine 2 in the accommodation room 10, and circulates as the cooling air C.

While the present invention has been described with reference to exemplary embodiments, it is to be understood that the invention is not limited to the disclosed exemplary embodiments. The scope of the following claims is to be accorded the broadest interpretation so as to encompass all draw modifications and equivalent structures and functions.

What is claimed is:

1. A cooling auxiliary unit used for an accommodation room configured to accommodate one or more electronic apparatuses, said cooling auxiliary unit comprising:

a duct member that stands upon a ventilation hole provided in a raised floor, and has an air passage connected to the ventilation hole, and at least one opening connected to the air passage; and a fan that moves air along the air passage, wherein the duct member includes:

a top plate configured to shield the air passage;

a first duct part that includes a first exhaust surface facing a predetermined direction parallel to the raised floor and intersecting a central axis of the duct member perpendicular to the raised floor, the first duct part having a first width, and the first exhaust surface having at least one of the openings; and a second duct part that is provided between the first duct part and the top plate and includes a second exhaust surface having at least another of the openings in the predetermined direction, a width of the second duct part gradually increasing in a direction from the first duct part to the top plate, wherein $2.1Px \leqq Dc \leqq 13Px$ is met where Px is the first width, and Dc is a second width of the top plate.

2. The cooling auxiliary unit according to claim 1, wherein the accommodation room is supplied with cooling air via the ventilation hole from under the floor, the cooling air being configured to pass the air passage, the openings exhaling the cooling air to the electronic apparatus, and the fan ascending the cooling air along the air passage.

3. The cooling auxiliary unit according to claim 1, wherein the duct member has a rectangular, circular, or polygonal section perpendicular to an upper vertical direction.

4. The cooling auxiliary unit according to claim 1, wherein the cooling auxiliary unit is arranged between a pair of electronic apparatuses, and wherein D is an interval between the pair of electronic apparatuses, and the duct member has the width Px, which meets $3Px \leqq D \leqq 10Px$.

5. The cooling auxiliary unit according to claim 1, wherein the duct member is made of resin.

6. The cooling auxiliary unit according to claim 1, wherein the fan is provided inside the duct member.

7. The cooling auxiliary unit according to claim 1, wherein the top plate is fixed onto the second duct part of the duct member at a position higher than the electronic apparatus.

8. The cooling auxiliary unit according to claim 7, wherein a bottom surface of the top plate is higher than the electronic apparatus in a vertical direction by 20 cm to 40 cm.

9. The cooling auxiliary unit according to claim 7, wherein the lowest portion of the second duct part is as high as the highest portion of the electronic apparatus.

10. The cooling auxiliary unit according to claim 1, wherein the top plate has a rectangular, circular, or polygonal section perpendicular to an upper vertical direction.

11. The cooling auxiliary unit according to claim 1, wherein the cooling auxiliary unit is arranged between a pair of electronic apparatuses, and $0.7D \leqq Dc \leqq 1.3D$ is met where D is a distance between the pair of electronic apparatuses.

12. A cooling system used for an accommodation room configured to accommodate an electronic apparatus, said cooling system comprising:

a cooler configured to supply cooling air; and a cooling auxiliary unit according to claim 1.

13. The cooling auxiliary unit according to claim 1, wherein the first duct part has a constant width equal to the first width.

14. The cooling auxiliary unit according to claim 1, wherein the second duct part has the second width at a portion where the second duct part is connected to the top plate.

15. The cooling auxiliary unit according to claim 1, wherein the second exhaust surface has a curved shape.

16. The cooling auxiliary unit according to claim 1, wherein the second exhaust surface has a linear shape.

17. A method of cooling a pair of electronic apparatuses using air exhausted from openings in a duct member that stands upon a ventilation hole provided in a raised floor and is provided between the pair of electronic apparatuses, the duct member having an air passage connected to the ventilation hole, and the openings being connected to the air passage, wherein the duct member includes:

a top plate configured to shield the air passage;

a first duct part that includes a first exhaust surface facing a predetermined direction parallel to the raised floor and intersecting a central axis of the duct member perpendicular to the raised floor, the first duct part having a first width, and the first exhaust surface having at least one of the openings; and a second duct part that is provided between the first duct part and the top plate and includes a second exhaust surface having at least another of the openings in the predetermined direction, a width of the second duct part gradually increasing in a direction from the first duct part to the top plate, wherein $2.1Px \leqq Dc \leqq 13Px$ is met where Px is the first width, and Dc is a second width of the top plate, and the method comprising the step of arranging the pair of electronic apparatuses so that $0.7D \leqq Dc \leqq 1.3D$ is met where D is a distance between the pair of electronic apparatuses.

* * * * *